United States Patent [19]

Aichelmann, Jr. et al.

[11] Patent Number: 5,276,846
[45] Date of Patent: Jan. 4, 1994

[54] FAST ACCESS MEMORY STRUCTURE

[75] Inventors: Frederick J. Aichelmann, Jr.; Bruce E. Bachman, both of Hopewell Junction, N.Y.; Robert E. Busch, Colchester, Vt.; Theodore M. Redman, Milton, Vt.; Endre P. Thoma, Colchester, Vt.

[73] Assignee: International Business Machines Corporation, Armonk, N.Y.

[21] Appl. No.: 829,608

[22] Filed: Jan. 30, 1992

Related U.S. Application Data

[63] Continuation of Ser. No. 335,165, Apr. 7, 1989, abandoned, which is a continuation-in-part of Ser. No. 907,192, Sep. 15, 1986, Pat. No. 4,845,664.

[51] Int. Cl.$^5$ .............................................. G06F 12/06
[52] U.S. Cl. ............................... 395/425; 364/DIG. 1
[58] Field of Search .......................... 364/200; 395/400

[56] References Cited

U.S. PATENT DOCUMENTS

| | | | |
|---|---|---|---|
| 4,488,298 | 12/1984 | Bond et al. | 371/2.2 |
| 4,608,687 | 8/1986 | Dutton | 371/13 |
| 4,789,966 | 12/1988 | Ozaki | 365/96 |
| 4,800,530 | 1/1989 | Itoh et al. | 365/230.04 |
| 4,833,657 | 5/1989 | Tanaka | 365/230.04 |

FOREIGN PATENT DOCUMENTS

| | | |
|---|---|---|
| 0109288 | 5/1984 | European Pat. Off. |
| 0115128 | 8/1984 | European Pat. Off. |
| 2117145A | 10/1983 | United Kingdom |

Primary Examiner—Joseph L. Dixon
Assistant Examiner—Reba I. Elmore

[57] ABSTRACT

A memory chip, comprising a chip memory section organized to hold a plurality of separate blocks of data, with each of the data blocks containing M individual data units; a circuit for addressing a given block of data in the chip memory section; and an N data unit chip parallel output interface from the memory chip where N is less than M, and N is greater than one. The memory chip further comprises a chip register for receiving from the chip memory section at least a portion of an addressed block of data, which portion comprises P data units, where P is greater than N, the chip register having P register stages for holding the P data units of the addressed data block, wherein the P register stages are grouped into at least a first and second groups of stages, with no group of stages comprising more than N register stages and with at least one of the groups of register stages having a plurality of stages. The memory chip also includes a gating structure for gating the respective groups of stages to the N data unit parallel output interface, the gating structure including at least a first gate circuit for gating in parallel the data units held in the first group of stages to the N data unit parallel output interface in accordance with a TOGGLE logic signal, and a second gate circuit for gating in parallel the data units held in the second group of stages to the N data unit parallel output interface in accordance with a NOT TOGGLE logic signal.

9 Claims, 3 Drawing Sheets

FAST ACCESS MEMORY STRUCTURE

This application is a continuation of application Ser. No. 07/335,165, filed Apr. 7, 1989, now abandoned, which is a continuation-in-part of Ser. No. 907,192 filed on 15 Sep. 1986, now U.S. Pat. No. 4,845,664.

DESCRIPTION

Background of the Invention

The present invention relates generally to semiconductor memory chips, and more particularly to on-chip structure for randomly accessing data in a block of data held in memory and transferring that data block off-chip through a narrow N bit chip output interface which is smaller than the data block.

In high end memory system applications, such as would be used in a large computer, one of the memory systems is the main store memory. The main store memory is typically a very large semiconductor memory system that is used to supply data and/or instructions to a cache memory. A cache memory is a small, fast, temporary submemory used to store words called up from the main store memory which are to be operated on. It has been found that when a word is called from the main store memory, that other words in its vicinity in the main store memory are generally also called up. Thus, the main store memory is organized in blocks of words and is designed to transfer an entire word block when one word within the block is randomly accessed. Accordingly, a call up to the main store memory comprises multiple transfers of words constituting a block from the main store to the cache memory. The block transfer rate and the size of each transfer is unique to each particular application of the memory, but the following points appear to be general. The starting address of each multi-word block transfer is random, with the initial target address containing a requested word memory coordinate. Once the transfer has started anywhere within the block, a wrap protocol is used to complete the transfer of the entire block in a predetermined order.

Figure 1:
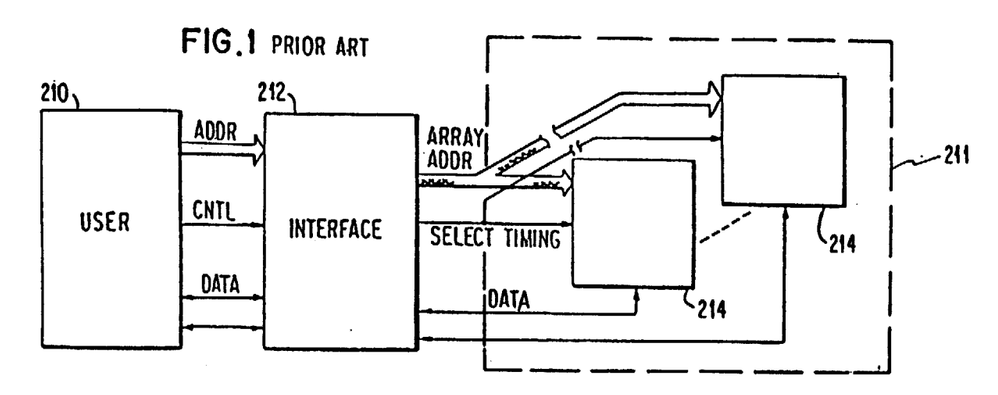
FIG. 1 is a schematic block diagram of a prior art memory system.

A typical design for a prior art memory system is shown in FIG. 1. In FIG. 1, a user 210 is connected to a main store memory 211 through an interface 212, which provides timing, control and data buffering logic to the main store memory 211. The main store memory 211 comprises a plurality of memory chips 214, connected in parallel to the interface 212. Usually, each memory chip 214 provides one parallel bit of data to the cache memory. The number of memory chips 214 is chosen to be equal to the number of bits in an ECC (error correction) word; 72 for many large computers. Thus, each bit of an ECC word is stored in and addressed from a separate memory chip 214. This design ensures that a given memory chip provides only 1 bit to a multi-bit ECC word, thereby preventing one chip failure from overwhelming the error correction capability of the memory.

Figure 2:
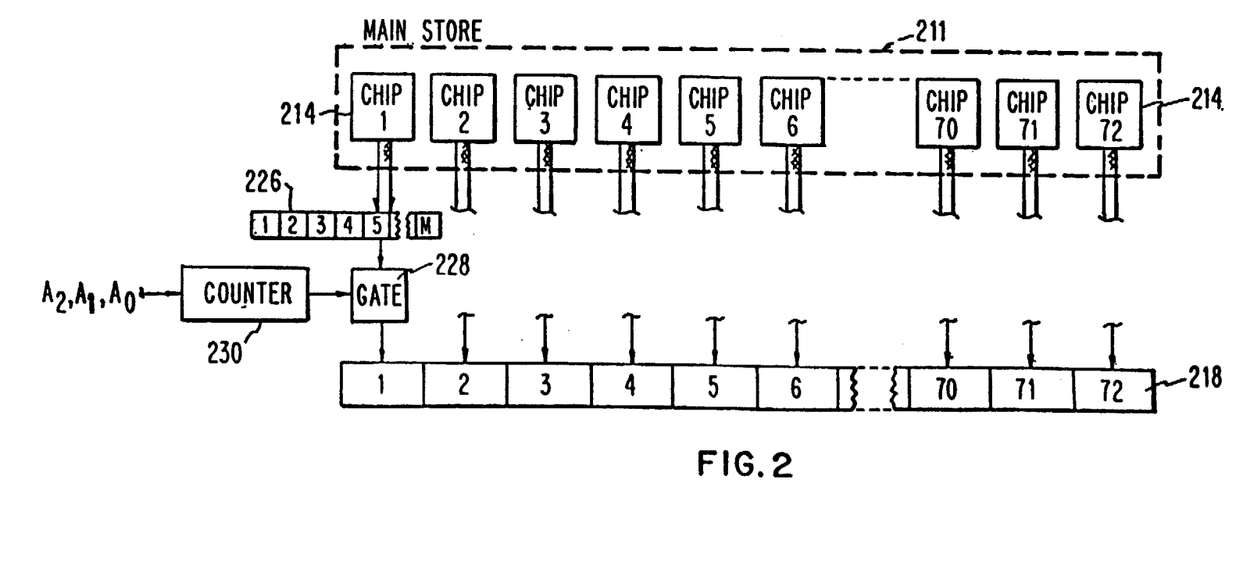
FIG. 2 is a schematic block diagram of a memory configuration may be used in the present invention.

In FIG. 2, a set of chips 214 (72 in this example) transfers bits in parallel to form individual 72 bit ECC words in a register 218. This transfer is accomplished for each chip 214 by reading bits from the given chip into an associated external register 226, and then serially gating those bits via an associated gate 228 to the word register 218 in accordance with the counts from a counter 230 which counts in a prescribed wrap order. Note that there is an external register 226, a gate 228, and a counter 230 for each memory chip 214, although only a register 226, a gate 228 and a counter 230 for the memory chip number 1 is shown in FIG. 2 for purposes of clarity.

Each memory chip is organized to hold a plurality of separate blocks of data bits, with each of these bit data blocks containing M individual data bits, where M may, in one embodiment, be equal to the number of words in a word block. By way of example, and not by way of limitation, each of these data blocks may contain 8 data bits representing an 8 word block.

Data in a memory chip is typically accessed by a target address which includes a row and a column address in the chip. The row address, generally called the RAS address, causes a series of data blocks stored in a given row to be accessed and held in the sense amplifier latches for the chip. The column address results in one bit in a given data block in the row to be accessed first via register 221, followed by the remaining bits in that data block in the wrap protocol order. In the present example, it is desired to transfer one 8-bit block containing the addressed target bit through a chip output (I/O) interface to the external register 226 for the chip. This external register 226 then provides this 8 bit data block serially to one of the stages in the word register 218.

It is essential that once the transfer of the bit data block begins, that it contain no gaps therein. This requirement results from a need that the memory contain a minimum number of chips, i.e., a single row of chips, that preserve a single bit per chip for ECC purposes. In order to ensure such a gapless transfer, it is generally required that the memory chip have a bit interface which is equal to the number of bits in the bit data block, i.e., 8 bits in the present example. However, such an 8 bit interface requires substantially more power than lower number bit interfaces, and has attendant chip cooling problems, increased switching noise, and significantly larger logic support requirements, resulting in lower reliability.

In the alternative, a series of transfers, for example, two 4-bit transfers could be utilized to transfer the 8 bit data block through a 4 bit chip output interface to the previously noted external register 226. Such a transfer would occur through a standard 8 bit internal holding register (double 4-bit buffer) which holds the addressed bit data block from the sense amplifier latches in the addressed row prior to output through the 4 bit chip output interface. This 8 bit holding register is generally designed to sequentially provide non-overlapping 4 bit sets to the 4 bit output interface in a prescribed sequence, for example stages 1–4 from the holding register on one timing pulse, followed by stages 5–8 on the next timing pulse. Transfers through a chip output interface are generally much slower than transfers from other registers. Thus, it is seen that this bit transfer procedure can be a viable transfer option because during the time that the first 4 bits are being read out of the external register 226, the remaining 4 bits can be transferred through the 4 bit chip output interface to the external register 226. This transfer process works well when the target address bit is the first bit in a 4 bit multiple sequence, i.e., 1, 5, etc. This is because, although the reading rate period, $t_{CHIP}$, from the 4-bit chip output interface, is considerably longer than the reading rate period, $t_{EXT}$, for a single stage in the external register 226, the $t_{CHIP}$ period is typically less than 4 $t_{EXT}$. Accordingly, while the first 4 bits are being read from the external register 226 and the word register 218, the next four bits can be transferred from the memory 4-bit output interface to the external register 226. Thus, bit 5 is ready for serial transfer at the same reading rate period $t_{EXT}$ despite the requirement for two separate transfers from the memory chip.

However, the above-described gapless bit transfer operation is only valid if the initial bit address is bit 1 or bit 5, so that three other bits can be read from the external register 226 before the bits from the next 4-bit interface transfer are required.

As previously noted, it is required that the first word accessed be randomly addressable and that succeeding bits be transferred in a desired wrap protocol. If bit 2, 3, or 4, or bit 6, 7, or 8 is addressed, it can be seen that there will be a time gap until the next 4-bit chip interface transfer is completed. For example, assume that bit 8 is the addressed target bit. In this instance, the bits 5-8 are transferred to the external register 226. The gate 228 gates bit 8 to the word register 218 in accordance with the signal from the counter 230. However, because the $t_{EXT}$ stage reading rate period is considerably less than the $t_{CHIP}$ 4-bit chip interface reading rate period, bits 1, 2, and 3 are not yet available from the chip output. Instead, a highly undesirable gap time, $t_{GAP}$, develops which can be several times the external register reading rate period $t_{EXT}$.

One technique for solving the above-described gapless transfer problem is disclosed in U.S. Pat. No. 4,796,222, wherein a bit data block is stored on two 4-bit interface memory chips. These two memory chips are then connected in parallel to an associated external register 226. However, such a double-chip memory configuration is not advantageous from a memory capacity standpoint.

The invention as claimed is intended to remedy this gapless transfer problem using a single memory chip per bit data block.

The advantage offered by the present invention is that a gapless bit data block transfer is achieved while minimizing the number of chips required for ECC integrity when the bit data block is larger than chip output interface. Concomitantly, this design eliminates the need for memory chips with large I/O interfaces and thus reduces the number of drivers, logic supports, and power and cooling requirements for a given memory card.

SUMMARY OF THE INVENTION

A memory chip, comprising
a chip memory section organized to hold a plurality of separate blocks of data, with each of the said data blocks containing M individual data units;
means for addressing a given block of data in the chip memory section;
an N data unit chip parallel output interface from the memory chip, where N is less than M, and N is greater than one;
chip register means for receiving from the chip memory section at least a portion of an addressed block of data, which portion comprises P data units,
where P is greater than N, the chip register means having P register stages for holding the P data units of the addressed data block, wherein the P register stages are grouped into at least a first and second groups of stages, with no group of stages comprising more than N register stages and with at least one of the groups of register stages having a plurality of stages; and gating means for gating the respective groups of stages to said N data unit parallel output interface, the gating means including at least a first gate circuit for gating in parallel the data units held in the first group of stages to the N data unit parallel output interface in accordance with a TOGGLE logic signal, and a second gate circuit for gating in parallel the data units held in the second group of stages to the N data unit parallel output interface in accordance with a NOT TOGGLE logic signal.

In an alternative embodiment, a data unit steering means may be included in each memory chip for reordering the data units before application to the N data unit interface. A circuit would then also be included for permitting data unit reordering only upon the occurrence of a STEERING logic signal.

DETAILED DESCRIPTION OF THE PREFERRED EMBODIMENT

In one embodiment, a gapless transfer may be accomplished by steering the data bits being accessed from the memory array of the chip to prescribed positions in a holding register, with the steering being accomplished in accordance with a specific target address. In essence, this embodiment is a new design for the control circuitry for a standard memory chip. The embodiment is designed to be utilized with a standard memory array chip composed of rows and columns of standard memory cells with multiple bit outputs. A typical memory chip of this type could be either a 256k×4 or a 2M×4 DRAM.

It should be noted at the outset, that the present invention has broad applicability to a wide variety of memory chips and memory arrays. The present invention is not limited to a particular output interface size, or to a particular bit data block size, or to a given word size. However, in order to provide a working example of the present invention, the present invention will be disclosed in the context of a memory chip organized in bit data blocks of 8 bits and using a 4-bit output interface.

Figure 3:
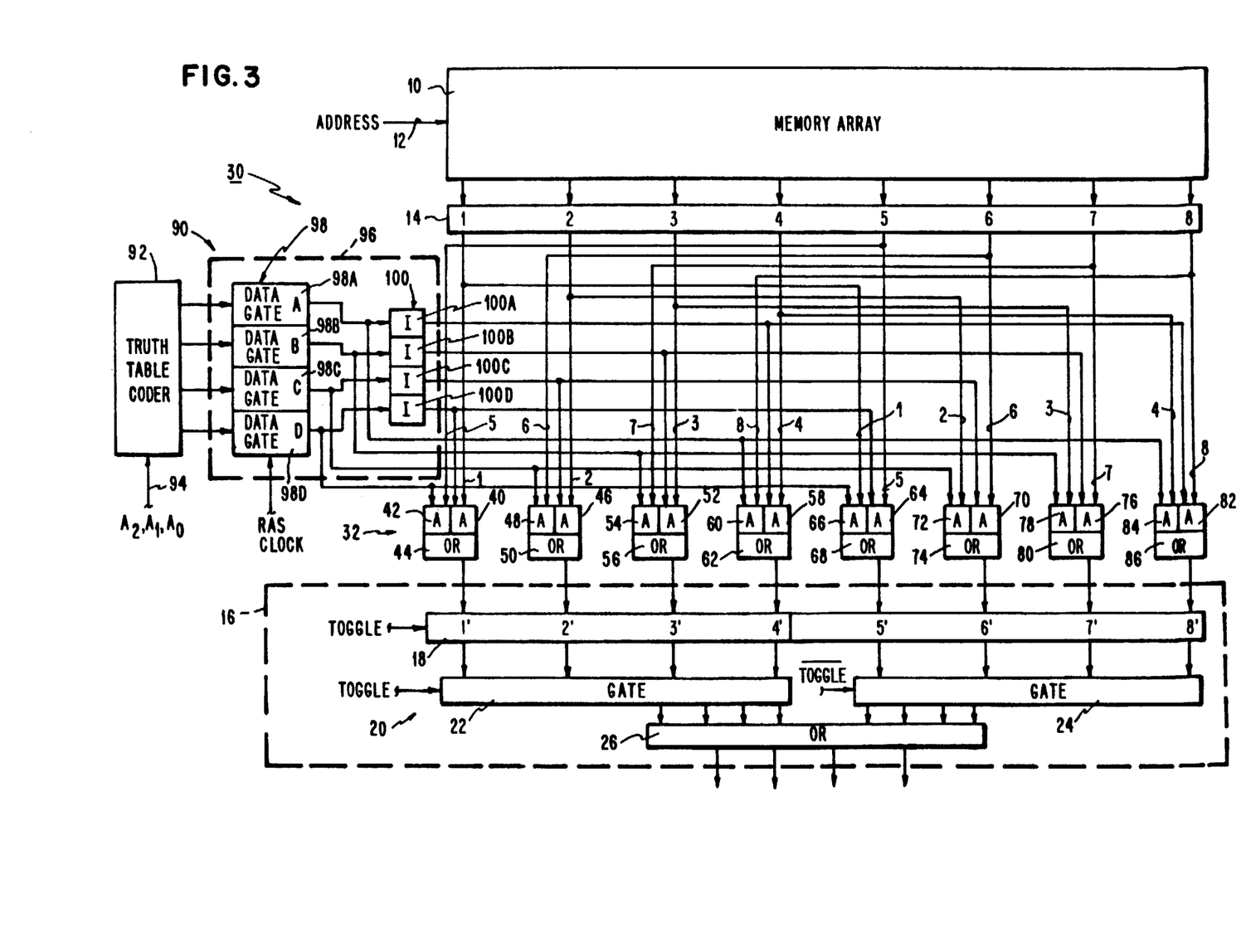
FIG. 3 is a schematic block diagram for use of one embodiment of the present invention.

Referring now to FIG. 3, a standard memory array composed of rows and columns of memory cells is designated by the block 10 in the Figure. An address line 12 is applied to the memory array 10 in order to access a particular target address bit. This address causes an entire row of memory cells to be accessed and their data applied to associated sense amplifiers. The data bits are then applied from these sense amplifiers to associated sense amplifier latches or buffer stages, represented by the register 14 in the Figure.

In this example, each row contains a plurality of 8-bit data blocks. The address on the address line 12 causes the sense amplifiers associated with one particular block of data bits to be selected and to provide those data bits to the sense amplifier latches or buffer stages 1-8, represented in the Figure by register 14.

In general, the chip memory array is organized to hold a plurality of separate blocks of data, with each of the data blocks containing M individual data bits in contiguous groups of N bits, where M is greater than N, with each data bit having its own unique address within the data blocks. In the present example, each data block comprises 8 bits, so that M=8. These 8 bits are held in the sense amplifier latches or buffer stages 1-8 as shown in the Figure.

The chip further comprises chip register means 16 for holding a given block of bit data, with chip register means 16 having at least M register stages 18 for holding the M data bits of the given data block. This chip register means 16 is organized with the M stages of the holding register 18 grouped into at least a first and a second contiguous group of N stages each, where N is the number of bits in the output interface for the chip. The chip register means 16 further includes a register gating means 20 for gating the first stage group of N register stages to the N bit output interface, followed in sequence, by the second stage group and higher groups. It should be noted that the chip register means 16 is organized so that a bit at one end of a bit data block is considered to be contiguous with a bit at the other end of the bit data block.

The first gating means 20 of chip register means 16 may be implemented in a variety of configurations. In FIG. 3, the first gating means 20 is shown to include a plurality of register gates 22 and 24, one for each register stage group of N stages. These register stages 22 and 24 gate the data in their associated register stage groups into an N bit output interface. This N bit output interface may be composed simply of an OR gate 26, or a gate which follows therefrom.

Each of the register gates 22 and 24 operates to pass N parallel outputs in accordance with a timing signal. Register gate 22 passes its N parallel outputs in accordance with a TOGGLE timing signal, while register gate 24 passes its N parallel outputs in accordance with a NOT TOGGLE timing signal. Accordingly, either one or the other of the parallel sets of N outputs, but not both, is applied to the N bit output interface gate 26.

In the present example, an 8-bit data block is utilized, so that there are 8 register stages 1'-8' in the holding register 18. Likewise, a 4-bit output interface is utilized, so that N=4. Accordingly, the holding register 18 provides a first set of 4 parallel bit outputs from register stages 1'-4' to the register gate 22 for application to the OR gate 26 upon the occurrence of a TOGGLE pulse. Likewise, the holding register 18 provides a second set of 4 parallel bit outputs from the register stages 5'-8' to the register gate 24 for application to the OR gate 26 upon the occurrence of a NOT TOGGLE pulse.

It can be seen that the M, or 8 in this example, data bits held in the sense amplifier stages 1-8 of latches 14 can be provided directly to the respective individual stages 1'-8' in the holding register 18. However, because the present memory array is randomly addressable and provides succeeding bits in a particular wrap protocol, the majority of bit transfers from the register 18 to the 4-bit output interface 26 will have gaps therein. In the worst case situation where bit number 4 or bit 8) is the target address bit, the first four bits 1-4 are passed via the stages 1-4 in the register 14 and the holding register stages 1'-4' to the register gate 22 and thence to the OR gate 26. This transfer of the bits 1-4 through the register gate 22 and the OR gate 26, constituting the 4-bit output interface, requires a reading rate $t_{CHIP}$.

These 4 bits are applied to the external register 226. The external register 226 (FIG. 2) then begins to read its addressed data through the gate 228 in accordance with the counter 230. However, since bit 4 was the target bit, and the wrap protocol requires bits 5, 6 and 7, a significant gap in time now occurs. At the end of the TOGGLE signal, the NOT TOGGLE signal occurs, thereby gating bits 5-8 through the register gate 24 to the OR gate 26 and thence to the other four stage locations in the external register 226. However, because the reading rate period, $t_{EXT}$, is considerably shorter than the reading rate period, $t_{CHIP}$, a considerable time gap occurs while the external register 226 is waiting for the next 4 bits of parallel data from the chip output interface 26. This highly undesirable gap can be several times the external reading rate period, $t_{EXT}$.

In order to solve the above-described data bit transfer problem and to provide gapless transfers of data bits regardless of which random bit is the target address bit, a chip steering means 30 is provided. Chip steering means 30 operates to provide in a first set, and in any desired order, the bit at the target address along with N−1 bits having following contiguous addresses in the memory wrap protocol from within the data block to the first group of N register stages in the holding register 18. This chip steering means 30 provides each successive set of N bits with following contiguous addresses in the wrap protocol to the second and higher register stage groups in the holding register 18. In the present example with N=4 and M=8, and assuming that the target bit is bit 4, then this chip steering means operates to provide bits 5, 6, 7 and 4 to the first group of four register stages 1'-4' in the holding register 18. Likewise, the chip steering means 30 provides the bits 1, 2, 3 and 8 to the second group of four register stages 5'-8' in the holding register 18. Thus, the bits 5, 6, 7 and 4 are provided first through the 4-bit output interface 26, followed by the bits 1, 2, 3, and 8. These bits are held in the external register 226 and are read therefrom in the proper order beginning with the target address bit 4 by means of the counter 230. The counter 230 is set to begin its count at bit 4 by applying the lower 3 address bits $A_2$, $A_1$, $A_0$ thereto. (The present counter is incremented after each data transfer and the results are decoded to select the appropriate bit to be outgated from the register 226.)

The basic logic circuit in the chip steering means comprises, for each register stage 1'-8' in the holding register 18, means 30 associated therewith for providing a different bit from each of the different bit groups in a given data block in the memory, and second means 32 for gating one and only one data bit from the providing means 30 to its associated register stage in accordance with the target address to thereby effect the wrap protocol. In a preferred embodiment, each bit in the bit groups has a bit position n therein, wherein n=1,2 , ... N; and wherein each of the holding register stages 18 is associated with a different prescribed bit position n. In this configuration, the steering means comprises, for each register stage, means 30 for providing a bit from its prescribed bit position from each of the bit groups in a given data block; and second means 32 for gating one and only one data bit from the providing means to its associated register stage in the holding register 18 in accordance with the target address to effect the wrap protocol.

FIG. 3 shows one embodiment for the providing means 30. In this embodiment, the providing means 30 provides both the 1 bit and the 5 bit (the n=1 bit position) to the second gating means 32 for the 1' stage in the holding register 18. This second gating means 32, in turn, comprises a plurality of AND gates, with a different AND gate for each bit group in the data block for receiving data therefrom. In the present example with an 8-bit data block, there are two bit groups, 1-4 and 5-8. Accordingly, each of the second gating means 32 associated with a given stage of the holding register 18 includes two AND gates. The AND gates associated with the 1' stage of the holding register 18 comprises an AND gate 40 for receiving the 1 data bit from the 1 stage of the sense amplifier latches 14, while an AND gate 42 is provided for receiving the 5 data bit from the 5 stage in the sense amplifier latches 14. Each of these AND gates 42 and 40 receives a control signal from a programming means 90, to be discussed below. The output from one of the AND gates 40 or 42 is applied to an OR gate 44 for providing bit data to the associated register stage 1' in the holding register 18.

Likewise, stage 2' in the holding register 18 has a second gating means 32 (n=2) associated therewith comprising an AND gate 46 with one input thereof for receiving the bit number 2 from the 2 stage of the sense amplifier latches 14, and further including an AND gate 48 for providing the bit number 6 from the 6 stage of the sense amplifier latches 14. The outputs from the AND gate 46 or the AND gate 48 is provided to the OR gate 50 for application to the 2' stage in the holding register 18.

This structural sequence is continued for each of the remaining stages in the holding register 18. Accordingly, bit number 3 from the sense amplifier latch 14 and bit number 7 from the sense amplifier latches 14 (n=3) are provided to the respective AND gates 52 and 54, for application through an OR gate 56 to the 3' stage of holding register 18. Bit number 4 and bit number 8 from the sense amplifier latches 14 (n=4) are provided to the AND gates 58 and 60, respectively, for application through the OR gate 62 to the 4' stage in the holding register 18. Bit number 5 and bit number 1 from the sense amplifier latches 14 (n=1) are provided to the AND gates 64 and 66, respectively, and the output from one of those gates is applied through the OR gate 68 to the 5' stage in the holding register 18. Bit number 6 and bit number 2 (n=2) are applied via the AND gates 70 and 72, respectively, to the OR gate 74 and the 6' stage in the holding register 18. Bit number 7 and bit number 3 (n=3) from the sense amplifier latches 14 are applied via the AND gates 76 and 78, respectively, through the OR gate 80 to the 7' stage in the holding register 18. Finally, bit number 8 and bit number 4 (n=4) are applied via the AND gates 82 and 84, respectively, through the OR gate 86 to the 8' stage in the holding register 18. Note that the data gates used for steering purposes may be implemented with the data gates normally used for partial stores within a multi-bit chip structure.

The providing means 30 further includes means for programming each of the second gating means 32 by generating control signals in response to a given target address for providing the target address bit along with the N−1 bits having following contiguous memory wrap protocol to the first group of N register stages in the holding register 18, and for providing each successive set of N bits with following contiguous addresses in the wrap protocol to the second and higher register stage groups in the holding register 18. The foregoing functional description is realized by applying a control signal from the programming means 90 as a second input to each of the AND gates 40, 42, 46, 48, 50, 52, 54, 58, 60, 64, 66, 70, 72, 76, 78, 82, and 84. These control signals ensure that one and only one data bit from the sense amplifier latches 14 is applied through the associated OR gate to each of the associated stages in the holding register 18. It should be noted that there are a variety of techniques available for generating control signals, and a variety of techniques for ORing the various bit numbers in the sense amplifier latches 14 for application to the holding register 18. In the embodiment shown in FIG. 3, 2M control signals are generated; one control signal for each AND gate in the second gating means 32. In this example embodiment, the programming means is implemented by means 92 for generating signals in accordance with a truth table in response to the target address applied on line 94. Means 96 is then provided for generating TRUE and COMPLEMENT control signals in response to the signals from means 92 for controlling the second gating means 32 for the register stages in the holding register 18. In one embodiment, this generating means 96 comprises a set of N data gates 98 and an associated set of inverting gates 100. Each of the data gates receives a signal from the truth table generating means 92 and provides a TRUE signal in response thereto. The output from each data gate is applied to control one of the pair of AND gates in each of the second gating means 32 which is associated with a prescribed bit position in each of the bit groups in a given bit data block. For example, for the bit position n=4, data gate 98A applies the TRUE output to control one of the pair of AND gates in the second gating means 32 which is associated with the 4' stage and the 8' stage in the holding register 18. Additionally, the TRUE output from the data gate 98A is applied to an inverting gate 100A which generates a COMPLEMENT output. The COMPLEMENT output from the inverting gate 100A is applied to control the other of the AND gates for the second gating means 32 associated with the 4' stage and the 8' stage of the holding register 18. In the example of FIG. 3, the TRUE output from the data gate 98A is applied to AND gate 60 along with the bit 8 output from the sense amplifier latches 14. Likewise, the TRUE output from the data gate 98A is also applied to the AND gate 84 along with bit 4 from the sense amplifier latches 14. The COMPLEMENT output from the inverting gate 100A is applied to the AND gate 58 along with the bit 4 output from the sense amplifier latches 14. This COMPLEMENT output from the inverting gate 100A is also applied to the AND gate 82 along with the bit 8 output from the sense amplifier latches 14. Accordingly, it can be seen that when the TRUE output from the data gate 98A is high, and the COMPLEMENT output from inverting gate 100A is low, then bit 8 from the sense amplifier latches 14 is applied through the AND gate 60, and the OR gate 62 to the 4' stage in the holding register 18. Likewise, bit 4 from the sense amplifier latches is applied through the AND gate 84 and the OR gate 86 to the 8' stage in the holding register 18. Alternatively, if the TRUE output is low and the COMPLEMENT output is high, then the bit number 4 from the sense amplifier latches 14 is applied through the AND gate 58 and the OR gate 62 to the 4' stage of the holding register 18. Likewise, the bit number 8 from the sense amplifier latches 14 is applied through the AND gate 82 and the OR gate 86 to the 8' stage of the holding register 18.

The data gates 98B, 98C and 98D and their associated inverting gates 100B, 100C and 100D are connected in a similar fashion to control the AND gates for the other prescribed bit positions n in the bit groups in the data block. Accordingly, the TRUE output from the data gate 98B is applied to AND gate 54 along with the bit 7 output from the sense amplifier latches 14. Likewise, a true output from the data gate 98B is applied to the AND gate 78 along with the bit 3 output from the sense amplifier latches 14. The associated inverting gate 100B applies its COMPLEMENT output to the AND gate 52 along with the bit 3 output from the sense amplifier latches 14 and to AND gate 76 along with the bit 7 output from sense amplifier latches 14. If the TRUE output from the data gate 98B is high, then bit number 7 from the sense amplifier latches 14 is applied through the AND gate 54 and the OR gate 56 to the 3' stage in the holding register 18. Likewise, a high signal for the TRUE signal from the data gate 98B causes the bit number 3 from the sense amplifier latches 14 to be applied through the AND gate 78 and the OR gate 80 to the 7' stage of the holding register 18.

Data gate 98C is likewise connected to have its TRUE output applied to the AND gate 48 along with bit number 6 from the sense amplifier latches 14. The TRUE output from the data gate 98C is also applied to the AND gate 72 along with the bit number 2 from the sense amplifier latches 14. The inverting gate 100C associated with the data gate 98C applies its COMPLEMENT output to AND gate 46 along with bit number 2 from the sense amplifier latches 14. The inverting gate 100C also applies its COMPLEMENT output to the AND gate 70 along with the bit number 6 from the sense amplifier latches 14.

Finally, the TRUE output from the data gate 98D is applied to the AND gate 42 along with the data bit number 5 from the sense amplifier latches 14. The TRUE output from the data gate 98D is also applied to the AND gate 66 along with the bit number 1 from the sense amplifier latches 14. The associated inverting gate 100D applies its COMPLEMENT output to the AND gate 40 along with the bit number 1 from the sense amplifier latches 14 and to the AND gate 64 along with the bit number 5 from the sense amplifier latches 14.

As noted previously, the four input signals to the data gates 98A-98D are generated by truth table coder 92 in response to the target bit address. This truth table configurations based on a desired truth table. In the embodiment shown in FIG. 3, a truth table of the type shown in Table 1 may be utilized to implement the bit steering. This truth table in Table 1 includes a column for a target bit, the last three digits of the binary address for that target bit, and four additional columns; one column for each of the data gates A-D.

The purpose of the truth table in Table 1 is to steer the data bits so that the target data bit and N−1 bits having following contiguous addresses in the memory wrap protocol occur within the first N register stages in the holding register 18. For example, if the target bit is bit number 4 in the sense amplifier latch, then it is desired to have bits 4, 5, 6 and 7 (the target bit and the first N−1 bits following the target bits) steered to the first four register stages 1'-4' in the holding register 18.

Referring now to the truth table in Table 1, for a target bit number 4 the truth table provides a one to data gate 98D, a one to data gate 98C, a one to data gate 98B, and a zero to data gate 98A. These four truth table outputs cause bit number 5 to be applied through the AND gate 42 and the OR gate 44 to the 1' stage in the holding register 18. Likewise, the bit number 6 is applied through the AND gate 48 and the OR gate 50 to the 2' stage of the holding register 18. Bit number 7 is applied through the AND gate 54 and the OR gate 56 to the 3' stage of the holding register 18. Finally, bit number 4 is applied through the AND gate 58 and the OR gate 62 to the 4' stage of the holding register 18. Likewise, bit number 1 is applied through the AND gate 66 and the OR gate 68 to the 5' stage, bit number 2 is applied through the AND gate 72 and the OR gate 74 to the 6' stage, bit number 3 is applied through the AND gate 78 and the OR gate 80 to the 7' stage, and finally the bit number 8 is applied through the AND gate 82 and the OR gate 86 to the 8' stage of the holding register 18.

The four bits held in the stages 1'-4' are gated by the TOGGLE signal through the gate 22 and the OR gate 26, which may be viewed as the N-bit output interface for the chip. As a result of the above operation, the bits 5, 6, 7, and 4 are held in the external register 226 in FIG. 2. These four bits may be gated out via the gate 228 to the appropriate stage in the word register 218 in accordance with the counter 230. The counter 230 and other support logic operates to provide the bits in the proper sequence of 4, 5, 6, and 7 to the appropriate stage in the word register 218. While these four bits are being sequentially read from the external register 226 to one stage in the word register 218, the bits 1, 2, 3 and 8 held in the 5'-8' stages of the holding register 18 may be transferred in accordance with the NOT TOGGLE timing signal through the gate 24 and the OR gate 26 output interface to the other four stages in the external register 226.

As another example, if the target bit is bit number 7, then the truth table coder 92 provides the data gate 98D with a zero output, 98C with a zero output, 98B with a one output and 98A with a one output. The control signals generated in response to these truth table signal inputs cause the 1'-4' stages in the holding register 18 to hold the bits 1, 2, 7 and 8, respectively. These bits are again gated upon the occurrence of the TOGGLE timing signal through the gate 22 and the OR gate 26 to the external register 226. These bits are then gated by the gate 228 in the proper order of 7-8-1-2 in accordance with the counter 230 which begins at the target address 110 for the target bit number 7. Likewise, in response to these truth table outputs, the 5'-8' stages of the holding register 18 hold the bits 5-6-3-4, respectively. These bits are gated in accordance with the NOT TOGGLE signal through the gate 24 and the OR gate 26 to the other four stages in the external register 226. The gating of this second group of 4 bits occurs again during the gating of the first group of 4 bits to the appropriate stage in the word register 218. After these first four bits 1, 2, 7, 8 have been gated in the proper order to the word register 218, the next 4 bit group 5-6-3-4 is gated via the gate 228 in the proper order to the same stage in the word register 218.

It can thus be seen from the above description that a gapless bit data transfer has been achieved while minimizing the number of chips required for ECC integrity when the M bit data block is larger than the chip N-bit output interface. The present design also eliminates the requirement for chips with large I/0 interfaces, thereby reducing the number of required drivers, logic supports, and reducing the power and cooling requirements for a given memory card. Such a memory card also has improved reliability because of the fewer required logic supports and the lower switching noise attendant to the use of a smaller I/O interface.

The present gapless transfer design provides the highest performance option for memory arrays where the chip data rate is larger than the system transfer rate.

In a further embodiment of the present invention, it may be desirable to bypass the steering circuitry and obtain an increased memory access speed by simply gating the data from the register gates 22 and 24 in accordance with the logic signals TOGGLE and NOT TOGGLE, as shown in FIG. 3. This embodiment could be implemented by setting the programming means 90 so that the data units in the register stages 1–8 in register 14 always are applied to the primed register stages with the same numbers in the register 18, i.e., stage 1 goes to stage 1', stage 2 goes to stage 2', etc. This ordering may be accomplished by setting the truth table to always read out 0000 to the data gates 98A, 98B, 98C, and 98D, regardless of what target address $A_2$, $A_1$, $A_0$ is applied on line 94 to the Truth Table Coder 92. Alternatively, a voltage level personalization of certain of the lines in the circuit could be performed during chip manufacture, or a set of gates could be added between the Truth Table Coder 92 and inverters 100, to effect this desired result.

To illustrate the above in more detail, all of the output lines from the DATA GATES 98A–98D could be tied by means of a conductive line to a low potential, such as ground potential, during manufacturing personalization to thereby eliminate steering. Alternatively, each of the DATA GATE 98 output lines could be initially connected to a low potential through a fuse. During personalization, if the steering function is desired, then the fuses connecting the DATA GATE 98 output lines to the low potential could be blown.

Figure 4:
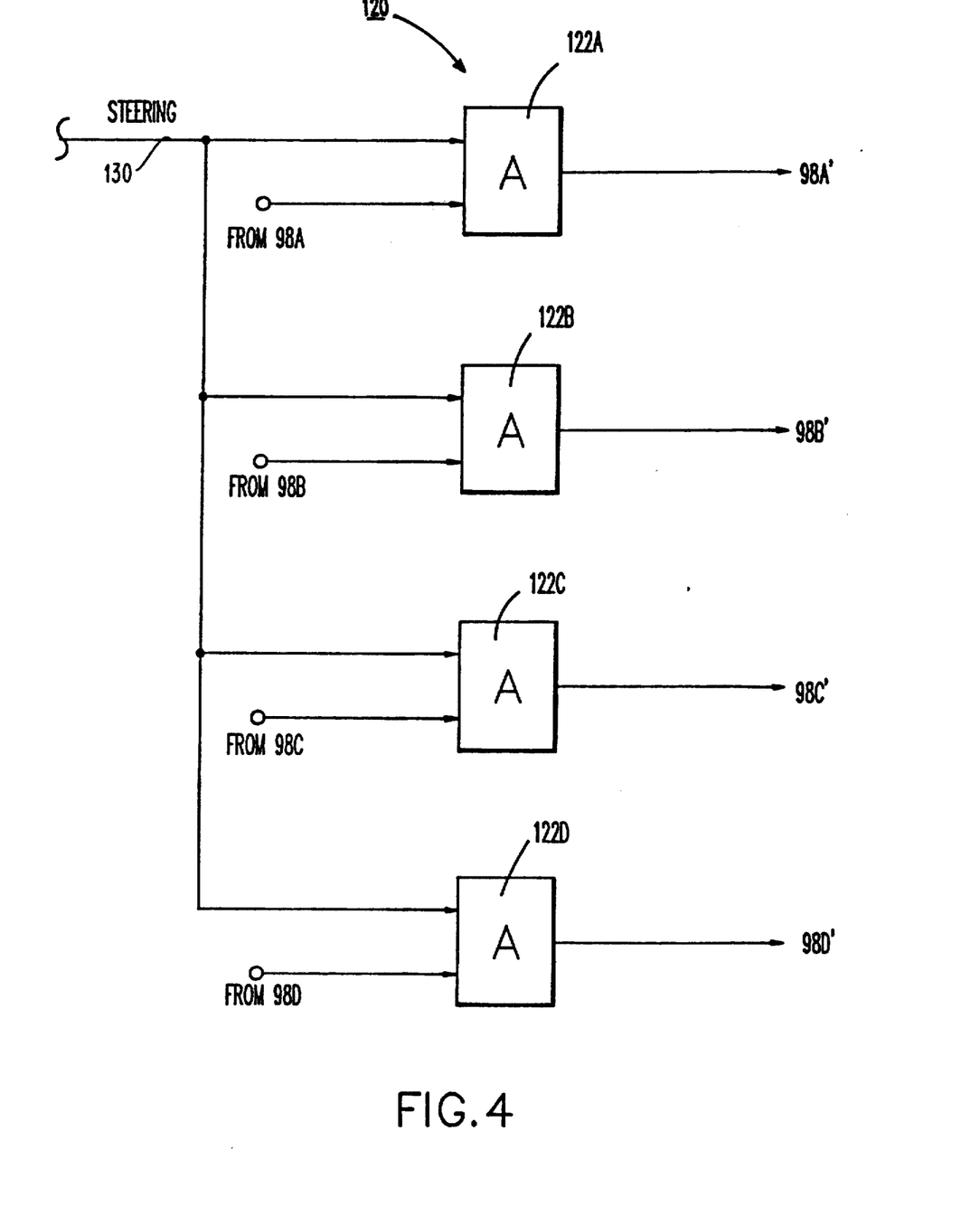
FIG. 4 is a schematic diagram of one embodiment of a means for preventing steering that may be incorporated into FIG. 3.

A yet further alternative is shown in FIG. 4. This alternative permits a single line personalization or electronic logic line to control whether or not the steering logic is implemented. Referring now to FIG. 4, a gating circuit 120 may be inserted either before or after the DATA GATES 98A–98D to control the steering lines so that either a set of 0's is provided, or so that the steering logic is implemented by the Truth Table Coder 92. By way of illustration, the gating circuit 120 is shown as being connected after the DATA GATES 98A–98D. The gating circuit 120 in this example comprises a respective AND gate 122A–122D associated with each of DATA GATE 98A–98D. Each AND gate 122 receives its associated DATA GATE output signal from its DATA GATE 98 as one input. A STEERING control line 130 is connected to another input of each AND gates 122. The output line 98' from each AND gate 122 is directly connected to the second gating means 32 and also to its associated inverting gate 100.

In operation, if the steering function is desired, then the STEERING line 130 is personalized or electronically controlled so that the STEERING line 130 is connected to a HIGH voltage. This HIGH voltage connection causes each of the AND gates 122 to pass its respective DATA GATE 98 logic signal to the second gating means 32 and to its respective inverting gate 100A–100D. Alternatively, if the STEERING control line 130 is connected to a low potential (NOT STEERING) via chip personalization or electronic control, then the AND gates 122 all have logic 0 outputs to the second gating means 32 and the respective inverting gates 100A–100D. Accordingly, no steering takes place.

There are obviously a variety of other methods that could be used to set the steering circuitry so that no steering takes place.

In the alternative to the above, since no steering is taking place in the above-described embodiment, the steering and other associated circuitry and registers could be eliminated so that the data units are read either directly from the memory array 10 to the register gates 22 and 24, or from the register 14 directly to the register gates 22 and 24, or in some other comparable fashion.

While the present invention has been particularly shown and described with reference to preferred embodiments therefor, it will be understood by those skilled in the art that the foregoing and other changes in form and detail may be made therein without departing from the spirit and scope of the present invention.

TABLE 1

| Target Bit Address ($A_2A_1A_0$—) | (98A) DGA | (98B) DGB | (98C) DGC | (98D) DGD |
|---|---|---|---|---|
| 1 | 000 | 0 | 0 | 0 | 0 |
| 2 | 001 | 0 | 0 | 0 | 1 |
| 3 | 010 | 0 | 0 | 1 | 1 |
| 4 | 011 | 0 | 1 | 1 | 1 |
| 5 | 100 | 1 | 1 | 1 | 1 |
| 6 | 101 | 1 | 1 | 1 | 0 |
| 7 | 110 | 1 | 1 | 0 | 0 |
| 8 | 111 | 1 | 0 | 0 | 0 |

We claim:

1. A random access memory chip, comprising:

a chip memory organized to hold a plurality of separate blocks of data, with each of said data blocks containing M individual data units in contiguous groups of N data units, where M is greater than N, and N is greater than one, with each data bit unit having its own unique address within said blocks, said memory having a predetermined wrap protocol, wherein said wrap protocol is a prescribed order for calling for all of said M data units in a given data block starting with a designated target data unit address and proceeding in said prescribed order, wherein a data unit at the end of a data block is contiguous in said prescribed order with a data unit at the beginning of said data block so that said beginning data unit follows said end data unit in said data block;

means for randomly addressing a data unit within a given block of data by means of a designated target address;

an N data unit chip output parallel interface from said memory;

chip register means for holding a given block of data, said chip register means having at least M register stages for holding said M data units of said given data block, wherein said M register stages are grouped into at least a first and a second contiguous groups of N stages each, said chip register means including first gating means for gating said first stage group of N register stages to said N data unit output parallel interface, followed in sequence, by said second stage group and higher groups, said first gating means comprising a first register gate for receiving and gating in parallel said first group of N stages to said N data unit output interface in accordance with a TOGGLE logic signal, and a second register gate for receiving and gating in parallel said second group of N stages to said N data unit output interface in accordance with a NOT TOGGLE logic signal; and chip steering means for providing in a first set, and in any desired order, the data unit at said target address along with N-1 data units having following contiguous addresses for said memory wrap protocol from within said data block to said first group of N register stages, and for providing each successive set of N data units with following contiguous addresses in said wrap protocol to said second and higher register stage groups, wherein the data unit, if any, following the end data unit in the data block for the wrap protocol is always the beginning data unit in the data block; and further including means for preventing said chip steering means from steering upon the occurrence of a NOT STEERING logic signal.

2. A random access memory chip, comprising:

a chip memory organized to hold a plurality of separate blocks of data, with each of said data blocks containing M individual data bits in an initial order in contiguous groups of N bits, where M is greater than N, and N is greater than one, with each data bit having its own unique address within said blocks, said memory having a predetermined wrap protocol wherein said wrap protocol is a prescribed order calling for said M bits to be accessed starting with a target bit address and proceeding in said block is contiguous in said prescribed order with a bit at the beginning of said data block so that said beginning bit follows said end bit in said data block;

chip address means for randomly addressing a data bit in a given block of data held in said chip memory by means of a target address;

an N bit chip output parallel interface from said chip memory;

means for holding said given data block in its initial data bit order within said chip;

means for reordering said data bit order into a reordered data bit order so that the bit with the target address along with N-1 bits having following contiguous addresses in said memory wrap protocol are held in any order in the first N positions in said reordered data bit order, and reordering so that each successive set of N bits with following contiguous addresses in said wrap protocol is held in second and higher N position groups, respectively, within said reordered data bit order, wherein the bit, if any, following the end bit in the data block is always the beginning bit in the data block; and first chip gating means for gating said first N positions in said reordered data bit order to said N bit chip output parallel interface, followed, in sequence, by said second N positions and higher N position groups, said first chip gating means comprising a first register gate for receiving and gating in parallel said first N positions to said N bit chip output parallel interface in accordance with a TOGGLE logic signal, and a second register gate for receiving and gating in parallel said second N positions to said N bit chip output parallel interface in accordance with a NOT TOGGLE logic signal; and further comprising means for preventing said reordering means from performing bit reordering, said preventing means operating upon the occurrence of a NOT STEERING logic signal.

3. A memory chip, comprising:

a chip memory section organized to hold a plurality of separate blocks of data, with each of said data blocks containing M individual data units;

means for addressing a data unit within a given block of data in said chip memory section;

an N data unit chip parallel output interface from said memory chip, where N is less than M, and N is greater than one;

chip register means for receiving from said chip memory section at least a portion of an addressed block of data, which portion comprises P data units, where P is greater than N, said chip register means having P register stages for holding said P data units of said addressed data block, wherein said P register stages are grouped into at least a first and second group of stages, with no group of stages comprising more than N register stages and with at least one of said groups of register stages having a plurality of stages; and gating means for gating said respective groups of stages to said N data unit parallel output interface, said gating means including at least a first gate circuit for gating in parallel the data units held in said first group of stages to said N data unit parallel output interface in accordance with a TOGGLE logic signal, and a second gate circuit for gating in parallel the data units held in said second group of stages to said N data unit parallel output interface in accordance with a NOT TOGGLE logic signal.

4. A memory chip as defined in claim 3, wherein said chip memory section comprises a random access memory.

5. A memory chip as defined in claim 3, wherein said chip memory section is organized so that M is equal to an integer multiple of N.

6. A memory chip as defined in claim 3, wherein P in said chip register means is equal to M.

7. A memory chip as defined in claim 3, wherein each of said first and second groups of stages has N register stages therein.

8. A memory chip as defined in claim 3, wherein said chip memory section is organized so that each data unit in said blocks of data has its own unique address, said chip memory section further being organized so that said M individual data units in said block of data are in groups of N data units, said chip memory section yet further being organized to have a predetermined wrap protocol, wherein said wrap protocol is prescribed order for calling for all of said M data units in a given data block starting with an N data unit group containing a designated target data unit address and proceeding in said prescribed order, wherein a data unit at the end of a data block is contiguous in said prescribed order with a data unit at the beginning of said data block so that said beginning data unit follows said end data unit in said data block; and wherein said addressing means comprises means for randomly addressing one of said data units within a given block of data by means of said target data unit address.

9. A memory chip, comprising:

a chip memory section organized to hold a plurality of separate blocks of data, with each of said blocks of data containing M individual data units organized into at least a first and a second groups of N data units each, where M is greater than N and N is greater than one, with each data unit having its own unique address within its respective data block, said chip memory section having a predetermined wrap protocol, wherein said wrap protocol is a prescribed order for calling for all of said M data units in a given data block starting with the one of said first or second N data unit groups containing a designated target data unit address and proceeding in said prescribed order, wherein a data unit at the end of a data block is contiguous in said prescribed order with a data unit at the beginning of said data block so that said beginning data unit follows said end data unit in said data block;

a circuit for randomly addressing one of said data units within a given block of data in said chip memory section by means of said target data unit address;

an N data unit chip parallel output interface from said memory chip;

a chip register for receiving from said chip memory section a given block of data containing said target data unit, said chip register having at least M register stages for holding said M data units of said given block of data, wherein said M register stages are grouped into a first and second groups of N stages each; and a gating circuit for gating in parallel the data units held in said first group of N stages to said N data unit parallel output interface in accordance with a TOGGLE logic signal, and for gating in parallel the data units held in said second group of N stages to said N data unit parallel output interface in accordance with a NOT TOGGLE logic signal.

* * * * *